(12) United States Patent
Doi

(10) Patent No.: US 7,765,449 B2
(45) Date of Patent: Jul. 27, 2010

(54) TEST APPARATUS THAT TESTS A PLURALITY OF DEVICES UNDER TEST HAVING PLURAL MEMORY CELLS AND TEST METHOD THEREFOR

(75) Inventor: Masaru Doi, Tokyo (JP)

(73) Assignee: Advantest Corporation, Tokyo (JP)

( * ) Notice: Subject to any disclaimer, the term of this patent is extended or adjusted under 35 U.S.C. 154(b) by 737 days.

(21) Appl. No.: 11/707,658

(22) Filed: Feb. 16, 2007

(65) Prior Publication Data

US 2007/0300114 A1  Dec. 27, 2007

Related U.S. Application Data

(63) Continuation of application No. PCT/JP2005/013326, filed on Jul. 20, 2005.

(30) Foreign Application Priority Data

Aug. 20, 2004  (JP) .............................. 2004-241655

(51) Int. Cl.
*G06F 11/00* (2006.01)
(52) U.S. Cl. ...................................... 714/738; 714/719
(58) Field of Classification Search ................. 714/738, 714/724, 725, 118, 119, 719
See application file for complete search history.

(56) References Cited

U.S. PATENT DOCUMENTS

| | | | | |
|---|---|---|---|---|
| 5,930,271 | A * | 7/1999 | Takahashi .................... | 714/738 |
| 6,167,545 | A * | 12/2000 | Statovici et al. ............. | 714/724 |
| 6,367,041 | B1 * | 4/2002 | Statovici et al. ............. | 714/724 |
| 6,643,180 | B2 | 11/2003 | Ikehashi et al. | |
| 6,865,705 | B2 | 3/2005 | Tomizawa et al. | |
| 6,903,566 | B2 | 6/2005 | Sudou et al. | |
| 7,010,734 | B2 * | 3/2006 | Brahme et al. .............. | 714/724 |
| 7,356,435 | B2 * | 4/2008 | Sato et al. ................... | 702/118 |
| 7,469,371 | B1 * | 12/2008 | Bapat et al. ................. | 714/725 |
| 2002/0048191 | A1 | 4/2002 | Ikehashi et al. | |
| 2003/0128045 | A1 | 7/2003 | Ochi | |
| 2003/0151962 | A1 | 8/2003 | Tomizawa et al. | |
| 2005/0073332 | A1 | 4/2005 | Sato | |

FOREIGN PATENT DOCUMENTS

JP  2001-93296  4/2001

(Continued)

OTHER PUBLICATIONS

International Search Report issued in International Application No. PCT/JP2005/013326 mailed on Nov. 1, 2005 and English translation thereof, 4 pages.

(Continued)

*Primary Examiner*—David Ton
(74) *Attorney, Agent, or Firm*—Osha • Liang LLP

(57) ABSTRACT

A test apparatus that tests a plurality of device under tests includes: a common pattern generating section that generates a common pattern being the pattern of a test signal common to the plurality of device under tests; an additional pattern storage section that previously stores therein an additional pattern to be added to the common pattern; and an each pattern adding section that reads the additional pattern for each of the device under tests based on a result signal outputted from the device under test and provides the additional pattern added with the common pattern to the device under test.

14 Claims, 8 Drawing Sheets

FOREIGN PATENT DOCUMENTS

| | | |
|---|---|---|
| JP | 2002-83499 | 3/2002 |
| JP | 2002-117699 | 4/2002 |
| JP | 2003-203495 | 7/2003 |
| JP | 2004-61368 | 2/2004 |

OTHER PUBLICATIONS

Chinese Office Action issued in Chinese Application No. 200580027677.3 mailed on Mar. 27, 2009 (15 pages).

Japanese Office Action for patent application No. 2004-241655, dated Oct. 27, 2009, and English translation thereof 6 pages.

English abstract from esp@cenet for Japanese patent application with Patent No. JP2002117699, Publication Date: Apr. 19, 2002, 1 page.

English Abstract from esp@cenet for Japanese patent application with Patent No. JP2003203495, Publication Date: Jul. 18, 2003, 1 page.

* cited by examiner

|  | Vpgm | | Vpass | |
| --- | --- | --- | --- | --- |
|  | SETTING VALUE | VOLTAGE | SETTING VALUE | VOLTAGE |
| X=0 | #47 | 14.20V | #01 | 5.60V |
| X=1 | #48 | 14.60V | #02 | 5.80V |
| X=2 | #49 | 15.00V | #03 | 6.00V |
| X=3 | #4A | 15.40V | #04 | 6.20V |
| X=4 | #4B | 15.80V | #05 | 6.40V |
| X=5 | #4C | 16.20V | #06 | 6.60V |
| X=6 | #4D | 16.60V | #07 | 6.80V |
| X=7 | #4E | 17.00V | #08 | 7.00V |
| X=8 | #4F | 17.40V | #09 | 7.20V |
| X=9 | #50 | 17.80V | #0A | 7.40V |
| X=10 | #51 | 18.20V | #0B | 7.60V |
| X=11 | #52 | 18.60V | #0C | 7.80V |
| X=12 | #53 | 19.00V | #0D | 8.00V |
| X=13 | #54 | 19.40V | #0E | 8.20V |
| X=14 | #55 | 19.80V | #0F | 8.40V |

FIG. 3

| | | |
|---|---|---|
| | X=0 | Status Fail |
| | X=1 | Status Fail |
| | X=2 | Status Fail |
| | X=3 | Status Fail |
| | X=4 | Status Fail |
| | X=5 | Status Fail |
| | X=6 | Status Fail |
| ① | X=7 | Status Fail |
| ④ | X=8 | Status Fail |
| ③ | X=9 | All Page Pass ← OPTIMUM COMBINATION |
| | X=10 | All Page Pass |
| ② | X=11 | All Page Pass |
| | X=12 | All Page Pass |
| | X=13 | All Page Pass |
| | X=14 | All Page Pass |

TEST APPARATUS THAT TESTS A PLURALITY OF DEVICES UNDER TEST HAVING PLURAL MEMORY CELLS AND TEST METHOD THEREFOR

CROSS REFERENCE TO RELATED APPLICATION

This is a continuation application of PCT/JP2005/13326 filed on Jul. 20, 2005 which claims priority from a Japanese Patent Application(s) NO. 2004-241655, filed on Aug. 20, 2004 the contents of which are incorporated herein by reference.

BACKGROUND

1. Field of the Invention

The present invention relates to a test apparatus and a test method. Particularly, the present invention relates to a test apparatus and a test method that test a plurality of device under tests.

2. Related Art

Generally, a test apparatus that tests a semiconductor device such as a flash memory. The test apparatus performs a functional test by applying test signals to DUT (Device Under Test) and comparing a result signal outputted from the DUT in response to the test signal with a reference voltage to determine pass/fail of the DUT based on whether the comparison result is corresponding to an expected value. Here, testing a flash memory, the test apparatus has to read as a test pattern an operational parameter of the flash memory, such as a setting value of a writing voltage to a memory cell as disclosed, for example, in Japanese Patent Application Publication No. 2001-93296.

Testing a plurality of flash memories in parallel, the test apparatus has to individually set the test pattern for each DUT because the characteristic for each DUT is different from each other. In addition, the test pattern for each DUT could be dynamically determined based on the result by judging pass/fail of the DUT in a test for writing of data.

However, when the general test apparatuses provide the test pattern to each DUT during providing a predetermined test pattern to a plurality of DUTs to test the plurality of DUTs, the test apparatus has to stop providing the test pattern to the DUTs once and set the test pattern by the software for controlling the test apparatus, so that it takes a long time to perform the test.

Thus, the object of the present invention is to provide a test apparatus a test method which are capable of solving the problem accompanying the conventional art. The above and other objects can be achieved by combining the features recited in independent claims. Then, dependent claims define further effective specific example of the present invention.

In order to solve the above described problems, a first aspect of the present invention provides a test apparatus that tests a plurality of device under tests. The test apparatus includes: a common pattern generating section that generates a common pattern being the pattern of a test signal common to the plurality of device under tests; a common pattern generating section that generates a common pattern being the pattern of a test signal common to the plurality of device under tests; an additional pattern storage section that previously stores therein an additional pattern to be added to the common pattern; and an each pattern adding section that reads the additional pattern for each of the device under tests based on a result signal outputted from the device under test and provides the additional pattern added with the common pattern to the device under test.

A second aspect of the present embodiment provides a test method of testing a plurality of device under test by using a test apparatus. The test method includes the steps of: generating a common pattern being the pattern of a test signal common to the plurality of device under tests. The test apparatus whose additional pattern storage section previously stores therein an additional pattern to be added to the common pattern; and reading the additional pattern for each of the device under tests from the additional pattern storage section based on a result signal outputted from each of the device under tests and provides the same added with the common pattern to each of the device under tests.

Here, all necessary features of the present invention are not listed in the summary of the invention. The sub-combinations of the features may become the invention.

According to the present invention, the test apparatus can perform a test by providing a test pattern to each device under test even if a plurality of device under test are tested in parallel.

BRIEF DESCRIPTION OF THE DRAWINGS

FIG. 3 shows an example of voltage value for each combination of Vpgm and Vpass and the setting value to set each voltage value in the DUT 30 according to an embodiment of the present invention;

DESCRIPTION OF EXEMPLARY EMBODIMENTS

Hereinafter, the present invention will now be described through preferred embodiments. The embodiments do not limit the invention according to claims and all combinations of the features described in the embodiments are not necessarily essential to means for solving the problems of the invention.

Figure 1:
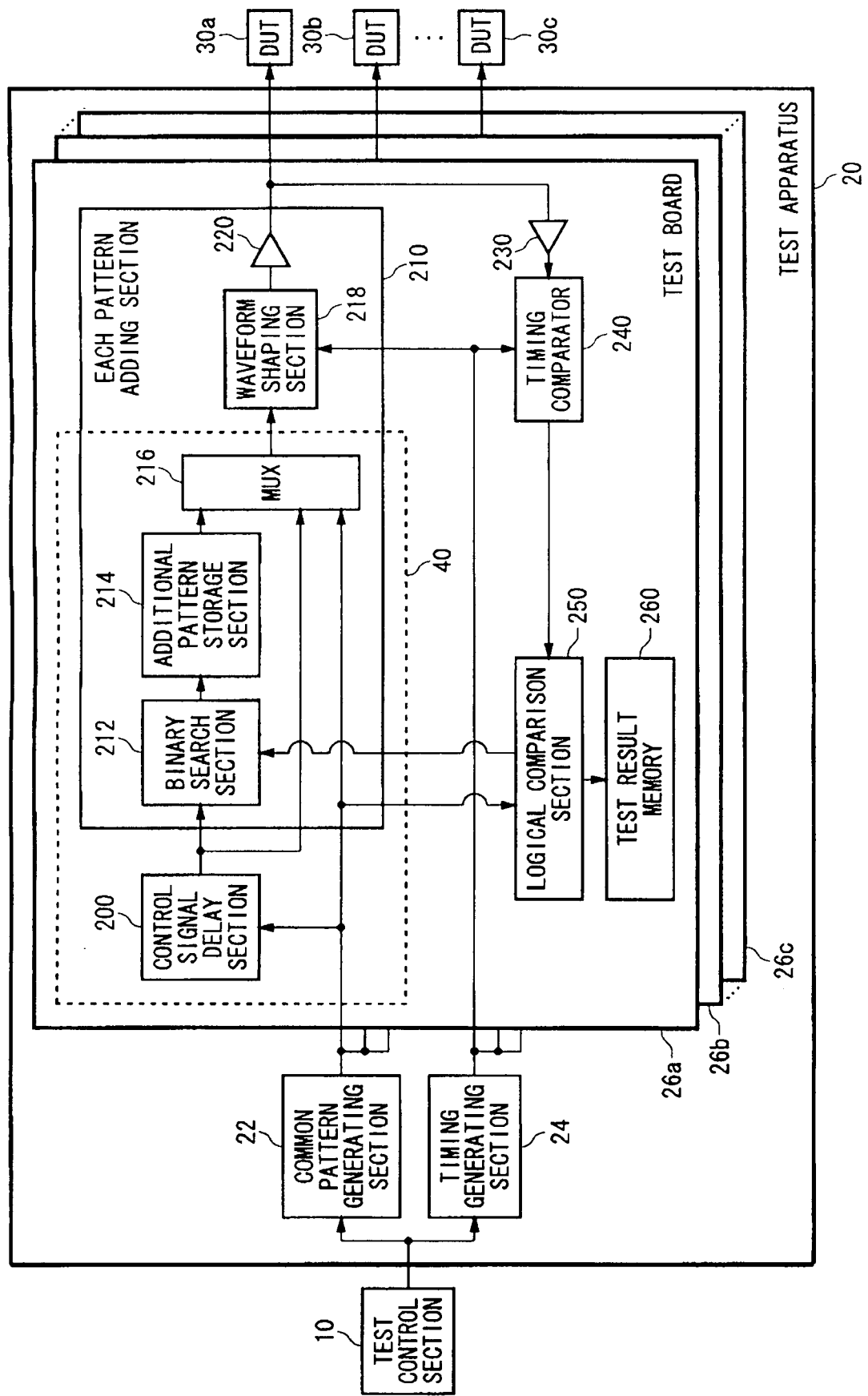
FIG. 1 is a block diagram showing an example of test apparatus 20 according to the present embodiment.

FIG. 1 is a block diagram showing an example of configuration of the test apparatus 20 according to an embodiment of the present invention. The test apparatus 20 is connected to a test control section 10 and a plurality of DUT (30a, 30b, ... 30c. hereinafter referred to as 30) and tests each of the plurality of DUTs 30 under the control of the test control section 10. For example, the test apparatus 20 performs a functional test for judging pass/fail of each DUT 30 such that the test apparatus 20 generates a test signal based on a predetermined test pattern, provides the same to each DUT 30 and determines whether the result obtained by comparing the result signal outputted from each DUT 30 in response to the test signal with an expected value corresponding to the pattern.

Figure 2:
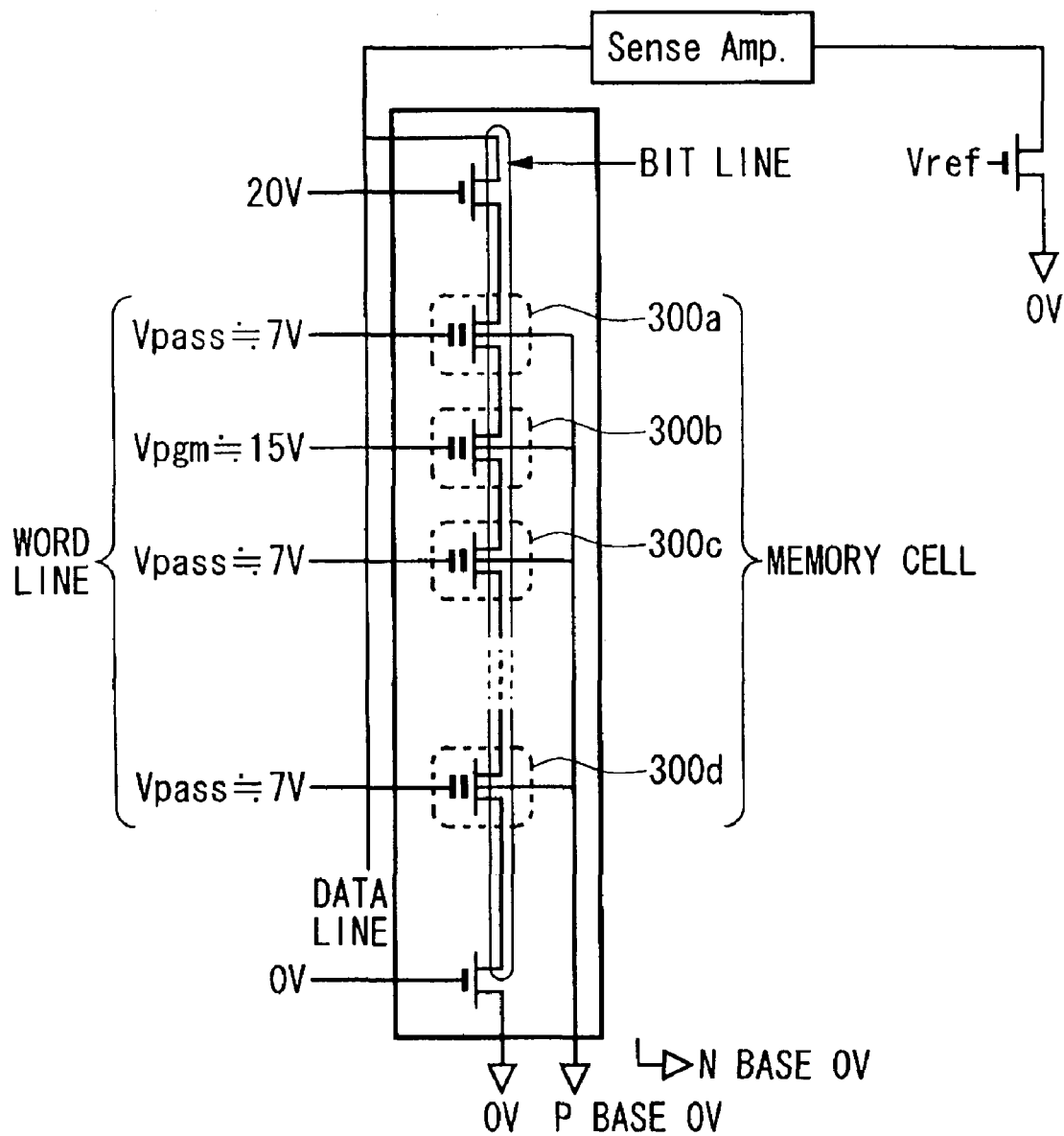
FIG. 2 shows an example of equivalent circuit of a DUT 30 according to an embodiment of the present invention.

Here, it will be described that the DUT 30 with reference to FIG. 2 and FIG. 3. FIG. 2 shows an example of equivalent circuit of the DUT 30 according to an embodiment of the present invention. The DUT 30 is an NAND flash memory and has a plurality of memory cells (300a, 300b, 300c . . . , 300d, herein after referred to as 300) connected in series on a data signal line. Writing data, the DUT 30 applies a writing voltage Vpgm (for example 15V) to the memory cell 300b to which the data should be written among the plurality of memory cells 300 while the DUT 30 applies a passing voltage (for example 7V) for passing a data signal indicative of the data to the other memory cell 300 to write the data to the memory cell 300b to which the data should be written.

Here, Vpgm and Vpass of the DUTs 30 have to be adjusted for each DUT 30 because the characteristic of each DUT 30 is different from each other. Specifically, the DUT 30 stores a plurality of reliable combinations of Vpgm and Vpass which are defined by such as a manufacturer of the DUT 30. Vpgm and Vpass are set as one combination among the plurality of combinations by providing a predetermined command to the DUT 30 and writing a setting value to an internal register in the DUT 30.

FIG. 3 shows an example of voltage value for each combination of Vpgm and Vpass and the setting value to set each voltage value in the DUT 30 according to an embodiment of the present invention For example, the DUT 30 sets Vpgm as 14.20V by writing a setting value #47 to the internal register and also sets Vpass as 5.60V by writing a setting value #1 to the internal register as shown in a line X=0. Here, the setting value to set the voltage value of Vpgm and the voltage value of Vpass for each combination is not disclosed, so that virtual setting values and voltage values are shown in FIG. 3.

Here, the DUT 30 has to perform a processing for detecting the optimum combination among a plurality of combinations of Vpgm and Vpass as shown in FIG. 3 as a preprocessing. Specifically, the test apparatus 20 provides an operational command code being capable of writing to the internal register of the DUT 30 the setting value corresponding to one combination in order to set Vpgm and Vpass to the one combination selected among the plurality of combinations of Vpgm and Vpass as shown in FIG. 3. Then, the test apparatus 20 performs a test for writing of data on the DUT 30 after correctly setting Vpgm and Vpass, and determines that the DUT 30 normally operates by the set one combination when the test result indicates Pass. Then, the test apparatus 20 detects as the optimum combination a combination having the lowest voltage value such as a combination having the lowest X value in FIG. 3 among the combinations of Vpgm and Vpass which allow the DUT 30 to normally operate. The processing as described above is generally referred to as a trimming. Here, when the above described trimming is performed on a plurality of DUTs 30, Vpgm and Vpass detected for each of the DUTs 30 could be different from each other because the characteristic for each DUT is different from each other.

The advantage of the test apparatus 20 according to an embodiment of the present invention is that the trimming is performed on the plurality of DUTs 30 having the characteristics different from each other in parallel without stopping the test pattern every time the different setting value is written to each of the DUTs 30. Moreover, The advantage of the test apparatus 20 according to an embodiment of the present invention is that the trimming is performed at shorter time by using a binary search.

It will be described that the configuration of the test apparatus 20 according to an embodiment of the present invention with reference to FIG. 1 again. The test apparatus 20 includes a common pattern generating section 22, a timing generating section 24 and a plurality of test boards (26a, 26b . . . 26c, herein referred to as 26). The common pattern generating section 22 is controlled by the test control section 10 and generates a common pattern being a pattern of test signals common to the plurality of DUTs 30. In addition, the common pattern generating section 22 also generates an expected value of the result obtained by comparing a result signal outputted from the DUT 30 in response to the test signal with the reference voltage. Moreover, the common pattern generating section 22 further generates a control signal for controlling a trimming to detect the optimum Vpgm and Vpass for the DUT 30. Here, the control signal may include the signal indicative of a timing at which the setting of Vpgm and Vpass of the DUT 30 is changed in the trimming. Then, the common pattern generating section 22 outputs the generated common pattern, expected value and control signal to each of the test boards 26, respectively. The timing generating section 24 is controlled by the test control section 10 and generates a timing signal indicative of the timing common to the plurality of DUTs 30. Then, the timing generating section 24 outputs the generated timing signal to each of the test boards 26.

Each of the test boards 26 is arranged corresponding to each of the plurality of DUTs 30 and provides a test signal to the corresponding DUT 30 based on the common pattern, expected value and control signal received from the common pattern generating section 22 and the timing signal received from the timing generating section 24 to test the DUTs. In addition, each of the test boards 26 includes a control signal delay section 200, an each pattern adding section 210, a level comparator 230, a timing comparator 240, a logic comparison section 250 and a test result memory 260. The control signal delay section 200 delays a control signal for controlling a trimming to detect the optimum Vpgm and Vpass of DUT 30, which are generated by the common pattern generating section 22. Then, the control signal delaying section 200 outputs the delayed control signal to the each pattern adding section 210.

The each pattern adding section 210 adds the individual pattern for the DUT 30 corresponding to the test board 26 to the common pattern and provides the same to the DUT 30. The each pattern adding section 210 includes a binary search section 212, an additional pattern storage section 214, a multiplexer 216, an waveform shaping section 218 and a driver 220. The binary search section 212 selects which of the Vpgm(s) and the Vpass(s) shown in FIG. 3 are as Vpgm and Vpass set to the DUT 30 when a trimming is performed Then, the binary search section 212 outputs information indicative of the selected Vpgm and Vpass to the additional pattern storage section 214.

The additional pattern storage section 214 previously stores an additional pattern to be added to the common pattern generated by the common pattern generating section 22 for each of the case that the result obtained by comparing the result signal outputted from the DUT 30 in response to the test signal with the reference voltage is corresponding to the expected value and the case that the result obtained by comparing the result signal outputted from the DUT in response to the test signal with the reference voltage is not corresponding to the expected value. Specifically, the additional pattern storage section 214 previously stores therein additional pattern for setting each of the plurality of Vpgm(s) and the plurality of Vpass(s) of the DUT 30. Here, the additional patterns may include setting value corresponding to each of the plurality of Vpgm(s) and the plurality of Vpass(s). Then, the additional pattern 214 receives information indicative of Vpgm and Vpass to be set to the DUT 30 for the trimming test, which are received from the binary search section 212 and outputs the additional pattern for setting each of Vpgm and Vpass indicated by the information to the multiplexer 216.

The multiplexer 216 selects either the common pattern received from the common pattern generating section 22 or the additional pattern received from the additional pattern storage section 214 based on the control signal for controlling the trimming, which is received from the control signal delay section 200. Specifically, when the received control signal indicates that the timing is to set Vpgm and Vpass of the DUT 30, the multiplexer 216 selects the additional pattern, i.e. the pattern of the signal for setting Vpgm and Vpass of the DUT 30. Meanwhile, when the received signal does not indicate that the timing is to set Vpgm and Vpass of the DUT 30, the multiplexer 216 selects the common pattern. Then, the multiplexer 216 outputs the selected pattern to the waveform shaping section 218. The waveform shaping section 218 shapes the waveform of the test signal provided to the DUT 30 based on either the common pattern or the additional pattern received from the multiplexer 216, and the timing signal received from the timing generating section 24. Then, The waveform shaping section 218 outputs the test signal to the driver 220. The driver 220 provides the test signal received from the waveform shaping section 218 to the DUT 30.

As described above, the each pattern adding section 210 can selectively read the additional pattern for setting Vpgm and Vpass of DUT 30 from the plurality of additional patterns stored in the additional pattern storage section 214, add the read additional pattern to the common pattern and provide the same to the DUT 30.

The level comparator 230 compares the result signal outputted from the DUT 30 in response to the test signal based on the common pattern provided by the drover 220 with a predetermined reference voltage and outputs the comparison result to the timing comparator 240. The timing comparator 240 holds the comparison result between the result signal and the reference voltage in the level comparator 230 at the timing based on the timing signal generated by the timing generating section 24 and outputs the held comparison result to the logical comparison section 250.

The logical comparison section 250 determines whether the comparison result received from the timing comparator 240 is corresponding to the expected value received from the common pattern generating section 22 and stores the result in the test result memory 260. Additionally, the logical comparison section 250 outputs the result to the binary search section 212. Then, the binary search section 212 selects Vpgm and Vpass to be set to the DUT 30 next among the plurality of Vpgm(s) and the plurality of Vpass(s) based on the result received from the binary search section 212. Here, the binary search section 212 determines Vpgm and Vpass to be selected by using the binary search method. Then, the binary search section 212 repeatedly performs the binary search to detect the optimum Vpgm and Vpass. Here, the detection of the optimum Vpgm and Vpass by using the binary search method by the binary search section 212 will be described in detail later.

The test apparatus 20 according to an embodiment of the present invention can add the individual pattern for each DUT 30 to the test signal pattern common to a plurality of DUTs and provide the same to each of the DUTs. In addition, the test apparatus 20 can determine the additional pattern added to the common pattern based on the result by the logical comparison section 250 in each DUT 30. Thereby a processing such as a trimming for changing the operation setting in the DUT 30 based on the result can be performed on a plurality of DUTs in parallel.

Moreover, the test apparatus 20 can control the processing to read an additional pattern for each DUT 30 different from each other not by such as a software executed in the test control section 10 but in the inside of the test apparatus 20, so that the trimming can be performed without stopping the test pattern. Thereby the time for the whole test including the trimming can be shortened.

Moreover, in the case that a trimming is performed to detect the optimum writing voltage Vpgm and passing voltage Vpass in the NAND flash memory, the test apparatus 20 according to an embodiment of the present invention can detect the optimum Vpgm and Vpass in each flash memory even if a plurality of flash memories with the operating characteristics different from each other are used. Therefore, the trimming can be completed in a short time.

Here, the configuration of the test apparatus 20 is not limited to that shown in the figure, but a configuration including various changes may be applicable. For example, the additional pattern storage section 214 may not be included in the each pattern adding section 210. In addition, the additional pattern storage section 214 may not arranged for each test board 26, i.e. DUT 30 but may be arranged common to the plurality of DUT 30. In such cases, the binary search section 212 may read the additional pattern corresponding to Vpgm and Vpass to be set to the DUT 20 from the additional pattern storage section 214 and output the same to the multiplexer 216.

Figure 4:
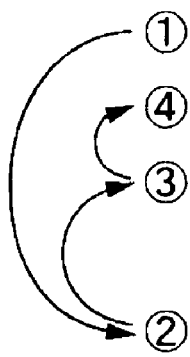
FIG. 4 shows an example of processing of an each pattern adding section 210 according to an embodiment of the present invention.

FIG. 4 shows an example of processing of the each pattern adding section 210 according to an example of the present invention. The additional pattern storage section 214 stores additional patterns for setting each of the plurality of writing voltage Vpgm(s) and the plurality of passing voltage Vpass(s) in ascending or descending order of Vpgm(s) and Vpass(s) in the present embodiment. For example, the additional pattern storage section 214 stores the additional pattern for setting each of Vpgm(s) and Vpass(s) in the order corresponding to incrementing or decrementing the value of X shown in FIG. 3. Here, the additional pattern may include the setting value to be written to the internal register in the DUT 30 for each of the corresponding Vpgm(s) and Vpass(s). Moreover, the additional pattern storage section 214 may store therein separately and sequentially each of the Vpgm(s) and Vpass(s), and also may sequentially store each of the Vpgm(s) and Vpass(s) in combination each of which X value is the same shown in FIG. 3.

FIG. 4 shows the result of pass/fail of a test for writing of data if each of Vpgm and Vpass are combined as shown in FIG. 3. Here, the test apparatus 20 according to an embodiment of the present invention set Vpgm(s) and Vpass(s)by combining not all Vpgm(s) and Vpass(s) but by combining less Vpgm(s) and Vpass(s) by using the binary search by the binary search section 212 to detect the optimum combination. Here, the optimum combination of Vpgm and Vpass in an example shown in FIG. 4 is X=9.

Hereinafter, it is described that the flow of detecting of the optimum combination of Vpgm and Vpass by using the binary search method by the binary search section 212. Firstly, the binary search section 212 selects Vpgm and Vpass for X=7 as Vpgm and Vpass to be set to the DUT 30, which are placed at the center of Vpgm(S) and Vpass(S) with X values 0-14 sequentially stored. Then, the binary search section 212 outputs to the additional pattern storage section 214 an address pointer in the additional pattern storage section 214, which indicates the additional pattern for setting each of the selected Vpgm and Vpass. Then, the additional pattern storage section 214 outputs the additional pattern indicated by the address pointer received from the binary search section 212 to the multiplexer 216. Then, the driver 220 provides the signal based on the additional pattern outputted by the additional pattern storage section 214 to the DUT 30 to set Vpgm and Vpass of the DUT 30 to Vpgm and Vpass for X=7. Next, the driver 220 provides the test signal based on the common pattern to the DUT 30 in order to perform the test for writing of data to the DUT 30. Then, the logical comparison section 250 determines whether the comparison result between a result signal outputted from the DUT 30 in response to the test signal with the reference voltage is corresponding to the expected value.

Here, the result signal may be a status signal indicating whether the writing of data to the DUT 30 is normally completed. Then, as shown in FIG. 4, the logical comparison section 250 determines that the result signal is not corresponding to the expected value, specifically, determines that the status signal indicative of the writing result is Fail indicating that writing of data to at least one page is failed.

Next, the binary search section 212 selects the other Vpgm and Vpass in order to set Vpgm(s) and Vpass(s) of the DUT 30 to higher voltage value based on that the test result received from the logical comparison section 250 indicates Fail. Specifically, the binary search section 212 selects the combination for X=11 at the center of permutation from X=8 just behind X=7 used last to X=14 being the end. More specifically, the binary search section 212 outputs to the additional pattern storage section 214 an address pointer obtained by adding 4 as an index to the address pointer for selecting X=7. Then, the driver 220, as well as the case for selecting X=7, provides the signal based on the adding pattern stored as X=11 in the additional pattern storage section 214 to the DUT 30 to set Vpgm and Vpass for X=11. Then, the logical comparison section 250 determines that the result of the test of writing performed following is Pass indicating that the writing for all pages are normally completed.

Next, the binary search section 212 selects the other Vpgm and Vpass in order to set Vpgm(s) and Vpass(s) of the DUT 30 to lower voltage value based on that the test result received from the logical comparison section 250 indicates Pass. Specifically, the binary search section 212 selects the combination for X=9 at the center of permutation from X=7 used at first to X=11 used last. More specifically, the binary search section 212 outputs to the additional pattern storage section 214 an address pointer obtained by subtracting 2 as an index from the address pointer for selecting X=11. Then, the driver 220 provides the signal based on the adding pattern stored as X=9 in the additional pattern storage section 214 to the DUT 30 to set Vpgm and Vpass of the DUT 30 to Vpgm and Vpass for X=9. Then, the logical comparison section 250 determines that the result of the test for writing of data performed following is Pass indicating that the writing to all pages are normally completed.

Next, the binary search section 212 selects the other Vpgm and Vpass in order to set Vpgm(s) and Vpass(s) of the DUT 30 to lower voltage value based on that the result received from the logical comparison section 250 is Pass. Specifically, the binary search section 212 selects the combination for X=8 at the center of permutation from X=7 used at first to X=9 used last. More specifically, the binary search section 212 outputs to the additional pattern storage section 214 an address pointer obtained by subtracting 1 as an index from the address pointer for selecting X=9. Then, the driver 220 provides to the DUT 30 the signal based on the additional pattern stored as X=8 in the additional pattern storage section 214 to set Vpgm and Vpass of the DUT 30 to Vpgm and Vpass for X=8. then, the logical comparison section 250 determines that the result of the test for writing of data performed following is Fail indicating that the writing to at least one page are normally completed.

Here, if the number of times at which Vpgm and Vpass of the DUT 30 are set attains four times being a predefined number of times for trimming, the change of combination is ended at this time. Here, the predefined number of time may be previously determined based on the number of setting value such as Vpgm abd Vpass stored in the additional pattern storage section 214. Then, the test apparatus 20 detects the combination for X=9 which is the last combination for the case that the result of the test for writing of data is Pass among the combinations of Vpgm(s) and Vpass(s) used by the binary search section 212 as the optimum combination of Vpgm and Vpass of the DUT 30.

Thus, the binary search section 212 can read the additional pattern for setting the minimum Vpgm and Vpass having the comparison result between the result signal outputted from the DUT 30 and the reference voltage which corresponding to the expected value from the plurality of additional patterns stored in the additional pattern storage section 214 by using the binary search method, and provide the same to the DUT 30.

Figure 5:
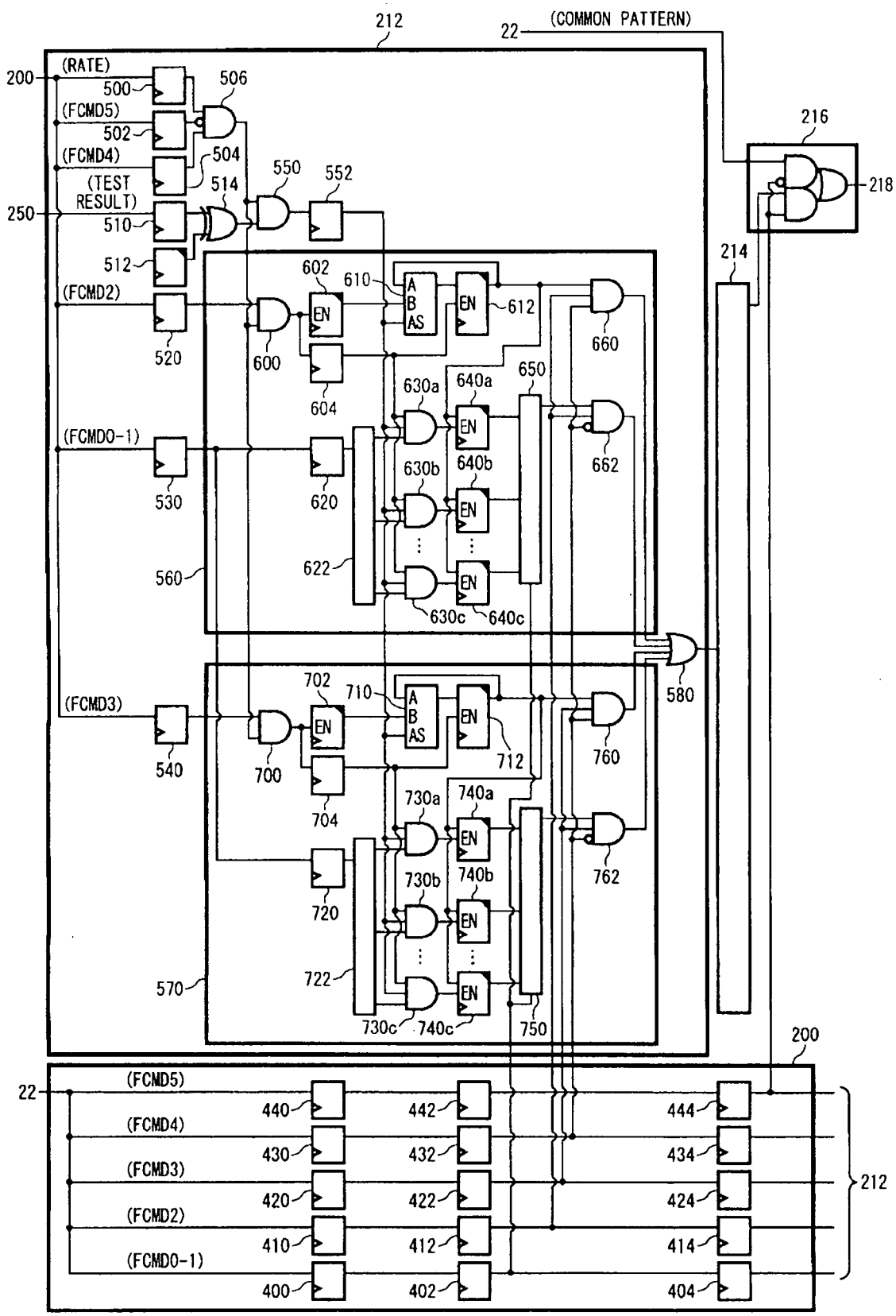
FIG. 5 shows an example of equivalent circuit in a range 40 shown in FIG. 1.

FIG. 5 shows an example of equivalent circuit in a range 40 shown in FIG. 1. It will be described with reference to FIG. 5 that how the trimming by using the binary method shown in FIG. 4 is performed on the circuit. The binary search section 212 shown in FIG. 5 operates based on FCMD0, FCMD1, FCMD2, FCMD3, FCMD4, and FCMD5 as an example of control signal generated by the common pattern generating section 22.

Firstly, the FCMD0 and the FCMD1 will be described. The binary search section 212 shown in the figure can store therein a plurality of address pointers of the additional pattern storage section 214 which indicate the result of trimming, i.e. the additional pattern for setting the optimum Vpgm and Vpass. Specifically, the binary search section 212 includes a plurality of registers being capable of storing the address pointers as the result of trimming. Then, the FCMD0 and the FCMD1 indicate which of resister stores the result of the trimming when the trimming is performed.

Next, the FCMD2 and the FCMD3 will be described. The binary search section 212 sequentially selects Vpgm(s) and Vpass(s) to be set to DUT 30 in trimming as shown in FIG. 4. Here, the binary search section 212 performs the following processing for each combination of each Vpgm and Vpass selected. As a first processing, the binary search section 212 outputs the address pointer on the additional pattern storage section 214, which indicates the additional pattern for setting each Vpgm and Vpass to the additional pattern storage section 214. As a second processing, the binary search section 212 receives the result of Pass/Fail of the test for writing performed under the condition that Vpgm and Vpass are set based on the additional pattern corresponding to the address pointer outputted by the first processing and calculates the address pointer indicative of the additional pattern for setting the following Vpgm and Vpass based on the result.

Then, when the FCMD2 indicates logic H, the binary search section 212 outputs the address pointer indicative of the additional pattern for setting Vpgm. In addition, when the FCMD3 indicates logic H, the binary search section 212 outputs the address pointer indicative of the additional pattern for setting Vpass in the first processing. Meanwhile, when FCMD2 indicates logic H, the binary search section 212 calculates the address pointer indicative of the additional pattern for setting the following Vpgm in the second processing. In addition, when the FCMD3 indicates logic H, the binary search section 212 calculates the address pointer indicative of the additional pattern for setting the following Vpgm in the second processing. Generally, Vpgm and Vpass are not set in accordance with a single operational command code in the flash memory at the same time but are individually set in accordance with a plurality of operational command codes. That is, usually it is not possible for the FCMD2 and the FCMD3 to indicate logic H at the same time in the first processing. However, the binary search section 212 can perform calculating the following address pointer on Vpgm and Vpass in parallel, so that it is possible for the FCMD2 and the FCMD3 to indicate logic H at the same time in the second processing.

Next, FCMD4 and FCMD5 will be described. The FCMD5 indicates that the multiplexer 216 selects which of the common pattern generated by the common pattern generating section 22 and the additional pattern outputted by the additional pattern storage section 214 and outputs the same. Specifically, when the FCMD5 indicates logic L, the multiplexer 216 selects the common pattern and outputs the same to the waveform shaping section 218, and when the FCMD5 indicates logic H, the multiplexer 216 selects the additional pattern and outputs the same to the waveform shaping section 18. Meanwhile, the FCMD4 indicates the different meanings dependent on which of logic H or logic H is indicated by FCMD5. When the FCMD5 indicates logic L, that is, when the FCMD4 indicates logic H provided that the multiplexer 216 selects the common pattern, the binary search section 212 performs the above-described second processing to calculate the address pointer indicative of the additional pattern for setting the following Vpgm and Vpass. Meanwhile, when the FCMD5 indicates logic H, that is, when the multiplexer 216 selects the additional pattern, the binary search section 212 performs the above described first processing. In this case, the FCMD4 indicates which of two kinds of registers is from which the address pointer outputted to the additional pattern storage section 214 is read by the binary search section 212. The two kinds of registers will be described later. The control signal delay section 200 and the binary search section 212 shown in FIG. 5 operate based on the timing of the same reference clock. Here, the binary search section 212 performs a series of processing which is performed on one combination of Vpgm and Vpass over a plurality of clocks. Therefore, when each circuit included in the binary search section 212 operates based on the FCMDs0-5, the control signal delay section 200 appropriately delays each of the FCMDs0-5 received from the common pattern generating section 22 and provides the delay signal to each circuit included in the binary search section 212 in order to operate each circuit based on the same FCMDs0-5 in a series of processing which is performed on the one combination of Vpgm and Vpass. Specifically, the control signal delay section 200 includes flip flops 400, 402 and 404 to delay the FCMD0 and FCMD1; flip flops 410, 412 and 414 to delay the FCMD2; flip flops 420, 422 and 424 to delay the FCMD3; flip flops 430, 432 and 434 to delay the FCMD4; and flip flops 440, 442 and 444 to delay the FCMD5.

In addition, the control signal delay section 200 may include a flip flop to further delay each control signal. For example, when the binary search section 212 performs the above described first processing based on the FCMDs0-5, receives the result of the test for writing from the logical comparison section 250 and performs the above described second processing, the control signal delay section 200 may delay the FCMDs0-5 used in the first processing by the number of steps the same of that of the signal indicative of the result of the test for writing and cause the binary search section 212 to perform the second processing based on the delayed FCMDs0-5. In this case, the control signal delay section 200 may delay each of the FCMDs0-5 by the number of steps different from each other. For example, the control signal delay section 200 may delay either the FCMD2 or the FCMD3 indicating logic H at the timing different from each other at the time point when it is used for the first processing by the time longer than the time of the other in order to indicate logic H at the same timing.

The binary search section 212 includes a flip flop 500, a flip flop 502, a flip flop 504, an AND gate 506, a flip flop 510, a direction register 512, a XOR gate 514, a flip flop 520, a flip flop 530, a flip flop 540, an AND gate 550, a flip flop 552, a first search block 560, a second search block 570 and an OR gate 580. The flip flop 500 holds at the timing of the reference clock a RATE signal as the reference of the pattern generating cycle generated by the common pattern generating section 22, which is delayed by the control signal delay section 200 in order to have the number of steps the same as that of the signal indicative of the result of pass/fail of the test for writing to the DUT 30. The flip flop 502 holds at the timing of the reference clock the FCMD5 which is delayed by the control signal delay section 200 in order to have the number of steps the same as that of the signal indicative of the result outputted by the logical comparison section 250. The flip flop 504 holds at the timing of the reference clock the FCMD4 which is delayed by the control signal delay section 200 in order to have the number of steps the same as that of the signal indicative of the result outputted by the logical comparison section 250. The AND gate 506 outputs a signal indicative of the logical product of the output signal of the flip flop 500, the inverted value of the output signal of the flip flop 502 and the output signal of the flip flop 504. Here, the signal outputted from the AND gate 506 indicates whether the binary search section 212 performs the above described second processing based on the result by the logical comparison section 250.

The flip flop 510 holds the signal indicating the result outputted by the logical comparison section 250 at the timing of the reference clock. The direction register 512 previously stores the logical value to control the searching direction of the binary search section 212 and outputs the logical value stored therein based on the reference clock. The XOR gate 514 outputs the signal indicative of the exclusive OR of the output signal of the flip flop 510 and the output signal of the direction register 512. Here, the searching direction indicates which of the address pointer obtained by incrementing the address pointer used last or the address pointer obtained by decrementing the address pointer used last is used as the address pointer indicative of the additional pattern for setting the following Vpgm and Vpass. When the result received from the logical comparison section 250 indicates Pass, the binary search section 212 calculates the address pointer obtained by decrementing the address pointer used last as the address pointer indicative of the additional pattern for setting the following Vpgm and Vpass. Alternatively, when the result received from the logical comparison section 250 indicates Pass, the binary search section 212 may calculate the address pointer obtained by incrementing the address pointer used last. In addition, usually the status signal obtained by writing to the flash memory indicates logic L for Pass and logic H for Fail. However, it is not necessarily that Pass/Fail of the result is corresponding to the logical value of the signal indicative of the result as described above because those are determined dependent on such as a semiconductor device used as the DUT 30 and setting items targeted for trimming. As described above, the searching direction, and the correspondence between the result and the logical value of the signal indicative of the result are changed dependent on such as the setting items targeted for trimming. However, the binary search section 212 according to the present embodiment can consistently have a desired correspondence between the test result and the signal outputted from the XOR gate 514 by changing the logical value stored in the direction register 512. For example, when the result is Pass, the logical value of the signal indicative of the result indicates logic L in the present embodiment. However, by storing logic L in the direction register 512, the binary search section 212 can calculate the address pointer obtained by decrementing the address pointer used last as the address pointer indicative of the additional pattern for setting the following Vpgm and Vpass when the result indicates Pass.

The flip flop 520 holds the FCMD2 delayed by the control signal delay section 200 at the timing of the reference clock in order to have the number of steps the same as that of the signal indicative of the result outputted by the logical comparison section 250. The flip flop 530 holds the FCMD0 and the FCMD1 delayed by the control signal delay section 200 at the timing of reference clock in order to have the number of steps the same as that of the signal indicative of the result outputted by the logical comparison section 250. The flip flop 540 holds the FCMD3 delayed by the control signal delay section 200 at the timing of reference clock in order to have the number of steps the same as that of the signal indicative of the result outputted by the logical comparison section 250.

The AND gate 550 outputs the signal indicative of the logical product of the output signal of the AND gate 506 and the output signal of the XOR gate 514. The flip flop 552 holds the output signal of the AND gate 550 at the timing of the reference clock. Here, the signal outputted by the flip flop 552 indicates the searching direction in the processing to calculate the address pointer indicative of the additional pattern for setting the following Vpgm and Vpass.

The first search block 560 calculates the address pointer indicative of the additional pattern for setting Vpgm and outputs the same, and then, stores therein the address pointer corresponding to the optimum Vpgm as the result of trimming among the calculated address pointers. The second search block 570 calculates the address pointer indicative of the additional pattern for setting Vpass and outputs the same, and then, stores therein the address pointer corresponding to the optimum Vpass as the result of trimming. As described above, the first search block 560 calculates the address pointer for Vpgm and the second search block 570 calculates the address pointer for Vpass in the present embodiment. Alternatively, the first search block 560 may calculate the address pointer for Vpass and the second search block 570 may calculate the address pointer for Vpgm. Moreover, as described above, when the FCMD2 indicates logic H, the binary search section 212 calculates or outputs the address pointer for Vpgm and when the FCMD3 indicates logic H, the binary search section 212 calculates or outputs the address pointer for Vpass in the present embodiment. Alternatively, when the FCMD2 indicates logic H, the binary search section 212 may calculate or output the address pointer for Vpass, and when the FCMD3 indicates logic H, the binary search section 212 may calculate and output the address pointer for Vpgm.

Firstly, the first search block 560 will be described. The first search block 560 includes an AND gate 500, a shift register 602, a flip flop 624, an adder-subtracter 610, a search register 612, a flip flop 620, an address-pointer-register-decoder 622, four AND gates (630a, 630b . . . 630c, hereinafter referred to as 630), four address-pointer-register (640a, 640b . . . 640c, hereinafter referred to as 640), an address-pointer-selector 650, an AND gate 660 and an AND gate 662.

The AND gate 600 outputs a signal indicative of the logical product of the output signal of the flip flop 520 and the output signal of the AND gate 506. Here, the signal outputted by the AND gate 600 indicates whether an address pointer indicative of the additional pattern for setting the following Vpgm. The shift register 602 stores an index value for calculating the address pointer indicative of the additional pattern for the case that the binary search section 212 calculates the following Vpgm by adding or subtracting the index value to the address pointer used last, and outputs the index value based on the timing of reference clock. Here, as shown in FIG. 4, the binary search method should decrease the index value to half every time the Vpgm to be set is changed. Therefore, when the output signal of the AND gate 600 indicates logic H, the shift register 602 decreases the index value stored therein to half so as to achieve a binary search by the binary search section 212. The flip flop 604 holds the output signal of the AND gate 600 at the timing of the reference clock.

The search register 612 stores the address pointer of the additional pattern storage section 214, which indicates the additional pattern for setting Vpgm and outputs the address pointer stored therein to the adder-subtracter 610, the address pointer-register 640 and the AND gate 660 based on the timing of the reference clock. Meanwhile, when the signal outputted from the flip flop 552 indicates logic H, the adder-subtracter 610 adds the address pointer outputted from the search register 612 and the index value outputted by the sift register 602 and outputs the result to the search register 612. In addition, the signal outputted from the flip flop 552 indicates logic L, the adder-subtracter 610 subtracts the index value outputted from the sift register 602 from the address pointer outputted from the search register 612 and outputs the result to the search register 612. Then, the search register 612 stores the added or subtracted result outputted by the adder/subtracter 610 at the timing at which the signal outputted by the flip flop 604 indicates logic H as a new address pointer. As described above, the address pointer stored in the search register 612 is added or subtracted by the index value stored in the shift register 602 based on the result of the test for writing by the logical comparison section 250 and is updated. Thereby the binary search of the address pointer by the binary search section 212 can be achieved.

The flip flop 620 holds the signal outputted by the flip flop 530 at the timing of the reference clock. The address pointer-register-recorder 622 decodes FCMD0 and FCMD1 received from the flip flop 620. Here, the FCMD0 and the FCMD1 indicate which of address pointer registers 640 stores the value of the address pointer stored in the search register 612. For example, the appropriate address pointer-register 640 for storing the value of the address pointer may be selected based on a two bits value including the FCMD1 as the high-order bit and the FCMD0 as the low-order bit. Specifically, when the FCMD1 indicates logic L and the FCMD0 also indicates logic L, the address pointer-register 640a is selected. Meanwhile, when the FCMD1 indicates logic L and the FCMD0 indicates logic H, the address pointer-register 640b may be selected. Then, the address pointer-register-decoder 622 outputs the signal indicative of the decoded result to each of the AND gates 630 arranged corresponding to each of the address pointer-registers 640. Here, the signal indicative of the decoded result is the signal which indicates logic H for the address pointer indicated by the FCMD0 and FCMD1, and logic L for the other address pointers 640. Each of the AND gates 630 is arranged corresponding to each of the address pointer-registers 640 and outputs the logical product of the output signal of the flip flop 604, the output signal of the flip flop 552 and the output signal of the address pointer-register-decoder 622. Here, the signal outputted by each of the AND gates 630 indicates logic H provided that the result of the test for writing by the logical comparison section 250 in the trimming of Vpgm indicates Pass and also provided that the corresponding address pointer-register 640 is selected by the FCMD0 and the FCMD1. When the signal outputted from the corresponding AND gate 630 indicates logic H, each of the address pointer-registers 640 stores the address pointer outputted by the search register 612. Here, the signal outputted from the AND gate 630 indicates logic H only when the test result by the logical comparison section 250 indicates Pass, therefore, the address pointer-register 640 stores the address pointer used last among the address pointers indicative of the additional pattern corresponding to Vpgm of which test result is Pass. That is, the address pointer-register 640 stores the address pointer indicative of the additional pattern corresponding to the optimum Vpgm at the time point at which the trimming is completed.

Here, the address pointer-register 640 van store data with the size larger than by 1 bit than the size of the address pointer. The region for 1 bit such as MSB stores information whether any address pointer indicative of the additional pattern corresponding to the optimum Vpgm is detected at the time point at which the trimming is completed. For example, it assumes that MSB in the address pointer-register 640 is initialized to 0 in an initializing step such as a starting step of the trimming. Here, when the test result by the logical comparison section for any Vpgm indicates Pass and the address pointer is stored in the address pointer-register 640, the MSB is set to 1. In this case, what the MSB is 0 at the point at which the trimming is completed indicates the test results for all Vpgm(s) are Fail and any address pointer indicative of the additional pattern corresponding to the optimum Vpgm is not detected.

In addition, each of the address pointer-registers 640 outputs the address pointer stored therein based on the timing of the reference clock. The address pointer register-selector 650 selects the address pointer outputted from the address pointer-resister 640 indicated by the FCMD0 and FCMD1 received from the flip flop 402 among the address pointers outputted from each of four address pointer-registers 640 and outputs the same to the AND gate 662.

The AND gate 660 outputs the signal indicative of the logical product of the output signal of the search register 612, the FCMD2 received from the flip flop 412 and FCMD4 received from the flip flop 432 to the OR gate 580. Meanwhile, the AND gate 662 outputs the logical product of the address pointer received from the address pointer-register-selector 650, the FCMD2 received from the flip flop 412 and the inverted value of the FCMD4 received from the flip flop 432 to the OR gate 580. That is, when the FCMD2 indicates logic H and the first search block is selected, i.e. when the address pointer indicative of the additional pattern for setting Vpgm is outputted to the additional pattern storage section 214, the FCMD4 indicates which of the search register 612 or the address pointer-register 640 is from which the outputted address pointer is read.

Next, the second search block 570 will be described. The second search block 570 includes an AND gate 700, a sift register 702, a flip flop 704, an adder/subtracter 710, a search register 712, a flip flop 720, an address pointer-register-decoder 722, four AND gates (730a, 730b . . . 730c, hereinafter referred to as 730), four address pointer-registers (740a, 740b, . . . 740c, hereinafter referred to as 740), an address pointer-register-selector 750, an AND gate 760 and an AND gate 762. Here, each component included in the second search block 570 has the function the same as that of the each component included in the first search block 560, so that the description is omitted. Here, when the FCMD2 indicates logic H, the search block 560 calculates, stores and outputs the address pointers for Vpgm. Meanwhile, when FCMD3 indicates logic H, the second search block 570 calculates, stores and outputs the address pointers for Vpass. In addition, the corresponding components are specifically the AND gates 600 and 700, the sift registers 602 and 702, the flip flops 604 and 704, the adder/subtracters 610 and 710, the search registers 612 and 712, the flip flops 620 and 720, the address pointer-register-decoders 622 and 722, the AND gates 630 and 730, the address pointer-registers 840 and 740, the address pointer-register-selectors 650 and 750, the AND gates 660 and 760 and AND gates 662 and 762, respectively. The AND gate 700 outputs the logical sum of the output signal of the flip flop 540 and the output of the AND gate 506. Here, the signal outputted from the AND gate 600 indicates whether the address pointer indicative of the additional pattern for setting the following Vpass will be calculated. The AND gate 760 outputs the signal indicative of the logical product of the output signal of the search register 712, the FCMD3 received from the flip flop 422 and the FCMD4 received from flip flop 432 to the OR gate 580. Additionally, the AND gate 762 outputs the signal indicative of the logical product of the address pointer received from the address pointer register-selector 750, the FCMD3 received from the flip flop 422 and the inverted value of the FCMD4 received from the flip flop 432 to the OR gate 580. That is, when the FCMD3 indicates logic H and the second search block 570 is selected, i.e. when the address pointer indicative of the additional pattern for setting Vpass is outputted to the additional pattern storage section 214, the FCMD4 indicates which of the search register 712 or the address pointer-register 740 is from which the outputted address pointer is read.

The OR gate 580 outputs the signal indicative of the logical sum of the output signal of the AND gate 660, the output signal of the AND gate 662, the output signal of the AND gate 760 and the output signal of the AND gate 762 to the additional pattern storage section 214. That is, when the FCMD2 indicates logic H, the OR gate 580 outputs the address pointer indicative of the additional pattern for setting Vpgm, which is outputted by the first search block 560. Meanwhile, when the FCMD3 indicates logic H, the OR gate 580 outputs the address pointer indicative of the additional pattern for setting Vpass, which is outputted by the second search block 570 to the additional pattern storage section 214.

The additional pattern storage section 214 reads the additional pattern indicated by the address pointer received from the OR gate 580 and outputs the same to the multiplexer 216. The multiplexer 216 selects the common pattern generated by the common pattern generating section when FCMD5 received from the flip flop 444 indicates logic L, alternatively, selects the additional pattern received from the additional pattern storage section 214 when the FCMD5 indicates logic H, outputs the signal indicative of the selected pattern to the waveform shaping section 218 and causes the driver 220 to provide a test signal based on the selected pattern to the DUT 30.

Here, the address pointer-register 640 or 740 selected by the FCMD0 and the FCMD1 may be used as the register to store the result of each trimming when trimmings for a plurality of setting items which are not limited to Vpgm and Vpass are sequentially performed. Additionally, each of the direction register 512, the shift registers 602 and 702, the search registers 612 and 712, the plurality of address pointer registers 640 and 740 is being capable of reading/writing the data stored therein from/to the outside, and a predetermined initial value may be stored in each resister corresponding to the setting items targeted for trimming such as Vpgm and Vpass in the initializing step in the trimming. For example, the direction register stores logic L, the shift registers 602 and 702 store #4, the search registers 612 and 712 store the address pointers indicative of the setting value for each of Vpgm and Vpass corresponding to X=7 shown in FIG. 3. Additionally, each of the address pointer-registers 640 and 740 may store #0. The configuration of the binary search section 212 may not be limited to the configuration shown in the figure but various changes may be added thereto. For example, the direction register 512 may not be provided for each of the test boards 26, i.e. each of the DUTs 30 but may be provided common to the plurality of DUTs 30. In addition, the shift register 602 or 702 may not be provided for each of the first search block 560 and the second search block 570 but either one of them may be provided in the binary search section 212.

Moreover, the shift register 602 or 702 may not be provided for each of the test boards, i.e. the plurality of DUTs 30 but may be provided common to the plurality of DUTs 30. Furthermore, it has been described that the binary search section 212 includes two search blocks including the first search block 560 and the second search block 570, however it may include only the first search block, or more search blocks such as the first search block 560 and the second search block 570. Furthermore, the first search block 560 and the second search block 570 may include any number of the address pointer-register 640 or 740. Here, it is understood that the control signals such as the FCMDs0-5 are changed in accordance with the above-described modification.

The test apparatus 20 according to the present embodiment can detect the optimum writing voltage Vpgm and passing voltage Vpass by using the binary searching method. Therefore, the trimming can be completed at shorter time in comparison with the case that the optimum Vpgm and Vpass are detected by sequentially setting the voltage value in ascending order, for example.

Figure 6:
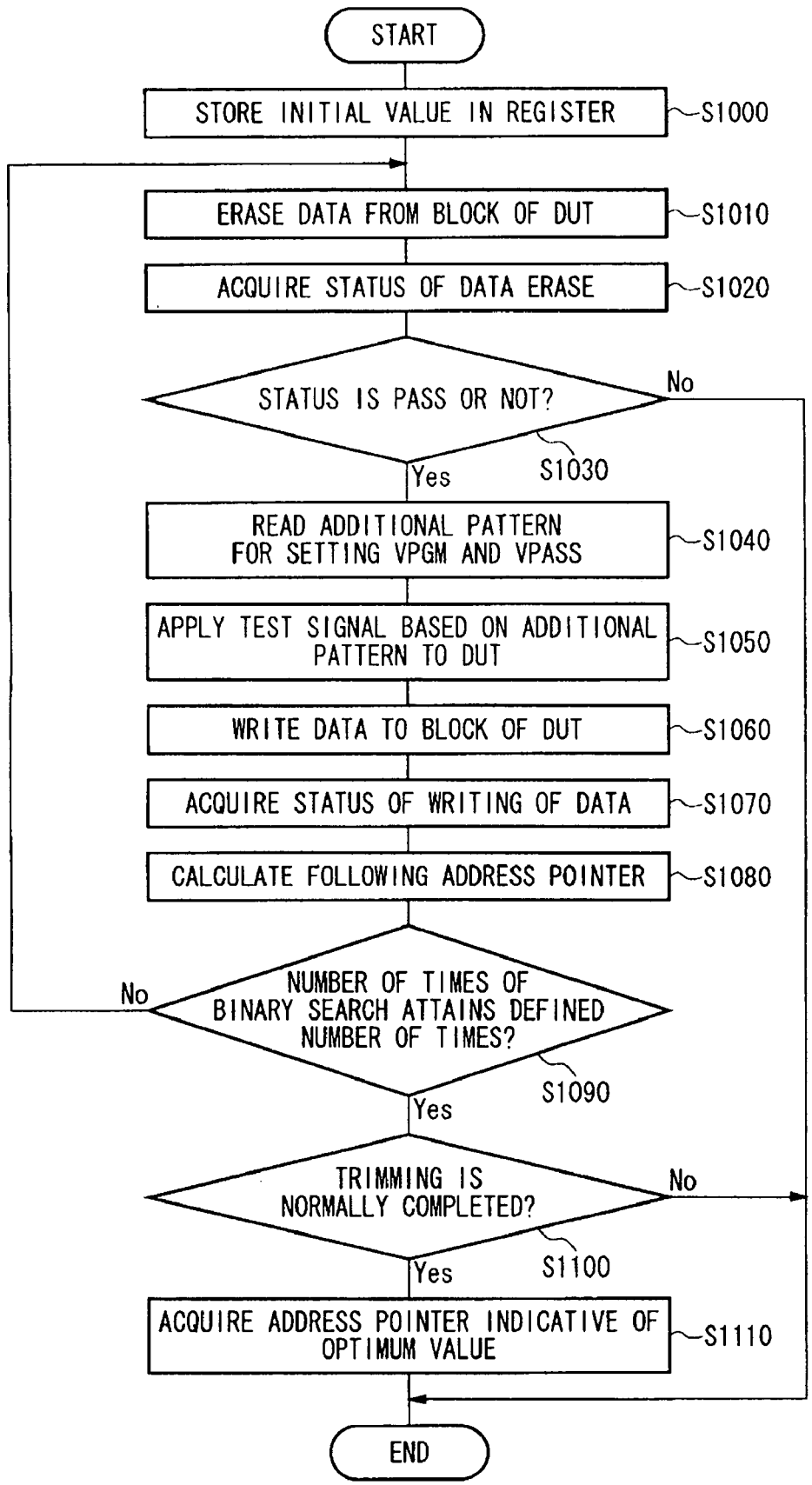
FIG. 6 is a flowchart showing an example of flow of processing of the test apparatus 20 according to an embodiment of the present invention.

FIG. 6 is a flowchart showing an example of flow of processing of the test apparatus 20 according to an embodiment of the present invention. Firstly, the binary search section 212 initializes a trimming by storing a predetermined initial value in each of the direction register 512, the shift registers 602 and 702, the search registers 612 and 712, the plurality of address pointer-registers 640 and 740 shown in FIG. 5.

Next, the test apparatus 20 provides an auto-blocking erase command to the DUT 30 to erase the data on the block on which the test for writing is performed (S1010). Next, the test apparatus 20 provides a status read command to the DUT 30 to acquire a status signal indicative of success or failure of erasing the data (S1020). Next, the test apparatus 20 judges whether the acquired signal indicates Pass (S1030). Here, when the status indicates Fail (S1030: No), the test apparatus 20 judges the DUT 30 is defective and stops testing.

Meanwhile, the status indicates Pass (S1030: Yes), the each pattern adding section 210 reads from the additional pattern storage section 214 the additional pattern for setting Vpgm and Vpass of the DUT 30 based on the address pointer outputted by the binary search section 212 (S1040). Next, the each pattern adding section 210 provides the test signal based on the additional pattern read from the additional pattern storage section 214 to the DUT 30 (s1050). Next, the test apparatus 20 provides an auto-programming command to the DUT 30 to write data to the block from which the data is erased in the S1010 (S1060). Next, the test apparatus 20 provides the status read command to the DUT 30 to acquire the status signal indicative of success or failure of writing the data (S1070). Next, the each pattern adding section 210 stores the address pointer calculated before and calculates an address pointer indicative of the additional pattern to be used for setting Vpgm and Vpass next by using the binary search method (S1080).

Next, the each pattern adding section 210 judges whether the number of times at which the binary search is performed, i.e. the number of times at which Vpgm and Vpass are set for the DUT 30 attains a predefined number of times such as four times (S1090). Here, when the number of times at which the Vpgm and Vpass are set does not attain the predefined number of times (S1090: No), the test apparatus 20 returns the processing to the S1010 and erase the data on the block of the DUT 30 again.

Meanwhile, when the number of times at which the Vpgm and Vpass are set attains the predefined number of times (S1090: Yes), the test apparatus 20 judges whether the trimming is normally completed based on whether MSB for each of the address pointer-registers 640 and 740 in which the address pointers are stored indicates logic H (s1100). Here, when MSB for each of the address pointer-registers 640 and 740 indicates logic L and writing of data is not normally performed even if any Vpgm and Vpass is set for the trimming (S1100: No), the test apparatus 20 judges that the DUT 30 is defective and stops testing. Meanwhile, MSB for each of the address pointer-registers 640 and 740 is logic H and the trimming is normally completed (S1100: Yes), the test apparatus 20 acquires the address pointers of the additional patterns corresponding to the optimum Vpgm and Vpass, which is stored in the address pointer-register 640 and 740 (S1110).

Here, the test apparatus 20 may read the additional pattern for setting the optimum Vpgm and Vpass based on the address pointers stored in the address pointer-registers 640 and 740 in order to set Vpgm and Vpass of the DUT 30 to the optimum value detected in the trimming, and provide the signal based on the additional pattern to the DUT 30.

Hereinbefore, it has been described with reference to FIG. 1-FIG. 6 that the trimming performed by the test apparatus 20 such that the writing voltage Vpgm and the passing voltage Vpass of the DUT 30 are set and the optimum setting value for each Vpgm and Vpass is detected based on the result of pass/fail of the test for writing. However, the trimming performed by the test apparatus 20 is not limited to the items shown in FIG. 1-FIG. 6, and may be performed for the other setting items of which setting value can be changed dependent on the result of pass/fail of the test for writing based on the result signal outputted by the DUT 30 and the expected value. Hereinafter, an example of trimming test for the other setting times will be described.

Figure 7:
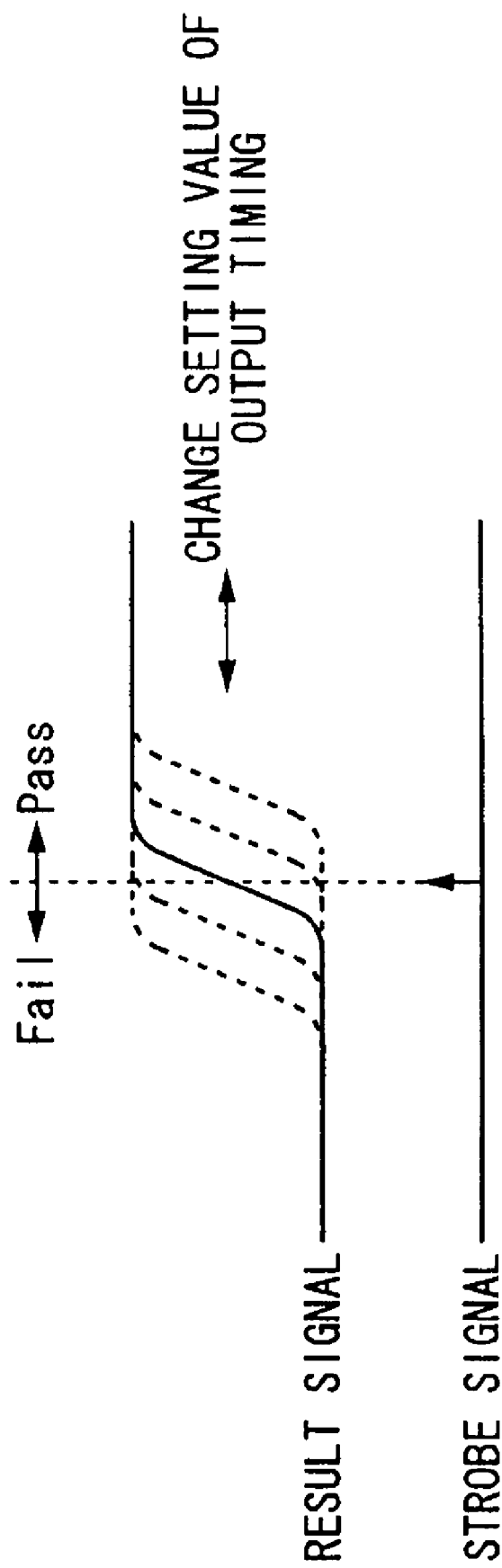
FIG. 7 shows another example of trimming by the test apparatus 20 according to an embodiment of the present invention.

FIG. 7 shows another example of trimming by the test apparatus 20 according to the present invention. The test apparatus 20 detects the optimum setting value for the output timing of a result signal outputted from the DUT 30 in the present embodiment. Specifically, the test apparatus 20 fixes a strobe signal indicative of the timing at which the result signal is compared with the reference voltage at the timing at which the result signal should be a predetermined logical value such as logic H and performs a test to judge whether the result by comparing the result signal with the reference voltage is corresponding to the expected value. Then, the test apparatus 20 detects the setting value for the optimum output timing as changing the output timing based on the result of the test.

The additional pattern 214 previously stores the additional pattern for setting each of the plurality of output timings of the result signal outputted by the DUT 30 in the present embodiment. Specifically, the additional pattern storage section 214 stores the additional pattern for setting each of the plurality of output timings in descending or ascending order of the output timing.

Then, the each pattern adding section 210 selectively reads the additional pattern for setting the output timing of the result signal from the plurality of additional pattern stored in the additional pattern storage section 214 and provides the same to the DUT 30.

Specifically, the each pattern adding section 210 selectively reads the additional pattern for setting the earliest output timing at which the result by comparing the result signal with the reference voltage is corresponding to the expected value from the plurality of additional patterns stored in the additional pattern storage section 214 by using the binary search method, and provides the same to the DUT 30.

More specifically, the binary search section 212 sequentially calculates address pointers in the additional pattern storage section 214 as binary-searching and causes the driver 220 to provide the test signal based on the additional pattern indicated by the address pointer to the DUT 30. Then, the binary search section 212 calculates the address pointers at the predefined number of times to store the address pointer indicative of the additional pattern which has the comparison result obtained by comparing the result signal with the reference voltage for setting the earliest output timing as the address pointer indicative of the additional pattern for setting the optimum output timing. Thus, the trimming for the output timing of the result signal can be performed.

The test apparatus 20 according to the present embodiment of the present invention, when the trimming for detecting the optimum output timing of the result signal is performed, can perform the trimming as changing the output timing of the DUT 30 by adding the pattern for each DUT 30 to the common pattern and providing the same to the DUT 30 based on the test result of each of the DUTs 30. Thereby when the plurality of DUTs 30 with the operating characteristics different from each other are employed, the optimum output timing for each of the DUTs 30 can be detected without stopping the test pattern, so that the trimming can be completed at a short time.

In addition, the test apparatus 20 can detect the optimum output timing of the result signal by using the binary search method, so that the trimming can be completed at shorter time in comparison with the case that the optimum timing is detected by sequentially setting the output timing in ascending order for example.

Figure 8:
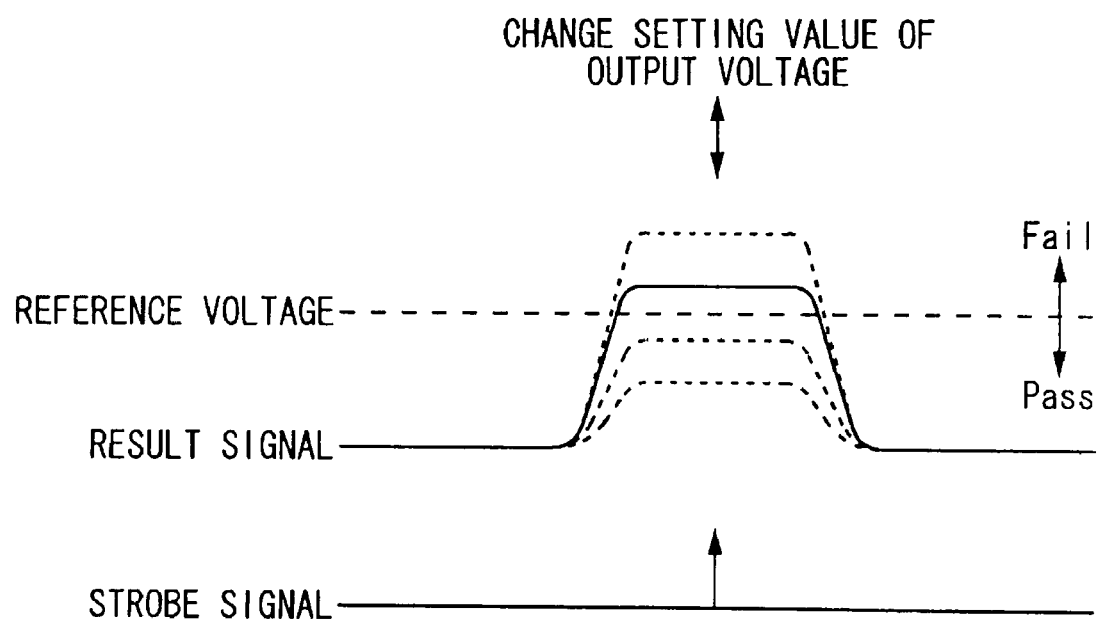
FIG. 8 shows further another example of trimming by the test apparatus 20 according to the present invention.

FIG. 8 shows further another example of trimming by the test apparatus 20 according to the present invention. In this case, the test apparatus 20 performs a trimming for detecting the optimum setting value for the output voltage of the result signal outputted from the DUT 30. Specifically, the test apparatus 20 performs a test to judge whether the result by comparing the result signal with the reference voltage is corresponding to the expected value as fixing the strobe signal to compare the result signal with the reference voltage at the timing at which the result signal should indicate a predetermined logical value such as logic L. Then, the test apparatus 20 detects the setting value of the optimum output voltage as changing the setting value of the output voltage based on the result of the test.

The additional pattern storage section 214 previously stores therein the additional pattern for setting each of the plurality of output voltages of the result signal outputted from the DUT 30 in the present embodiment. Specifically, the additional pattern storage section 214 stores the additional pattern for setting each of the plurality of output voltages in ascending order or descending order of the output voltage.

Then, the each pattern adding section 210 selectively reads the additional pattern for setting the output voltage of the result signal from the plurality of additional patterns stored in the additional pattern storage section 214 and provides the same to the DUT 30. Specifically, the each pattern adding section 210 selectively reads the additional pattern for setting the lowest output voltage having the result by comparing the result signal with the reference voltage which is corresponding to the expected value from the plurality of additional patterns stored in the additional pattern storage section 214 and provides the same to the DUT 30. More specifically, the binary search section 212 sequentially calculates the address pointers in the additional pattern storage section 214 as binary-searching based on whether the comparison result is corresponding to the expected value and causes the driver 220 to provide the test signal based on the additional pattern indicated by the address pointer to the DUT 30. Then, the binary search section 212 calculates the address pointers at the predefined number of times to store the address pointer indicative of the additional pattern for setting the lowest output voltage having the result by comparing the result signal with the reference voltage which is corresponding to the expected value as the address pointer indicative of the additional pattern for setting the optimum output voltage. Thus, the trimming for the output voltage of the result signal can be performed.

The test apparatus 20 according to the present embodiment performs the trimming for detecting the optimum output voltage of the result signal such that the additional pattern for each DUT 30 is added to the common pattern and provided the same to the DUT 30 based on the test result for each DUT 30, so that the trimming can be performed as changing the output voltage of the DUT 30. Thereby even if the plurality of DUTs 30 with the operating characteristic different from each other are employed, the optimum output voltage for each DUT 30 can be detected without stopping the test pattern, so that the trimming can be completed for a short time.

Moreover, the optimum output voltage of the result signal can be detected by using the binary search method, so that the trimming can be completed at shorter time in comparison with the case that the optimum output voltage is detected by sequentially setting the output voltage in ascending order of the output voltage.

While the present invention has been described with the embodiment, the technical scope of the invention not limited to the above described embodiment. It is apparent to persons skilled in the art that various alternations and improvements can be added to the above-described embodiment. It is apparent from the scope of the claims that the embodiment added such alternation or improvements can be included in the technical scope of the invention.

As evidenced by the above description, according to the present embodiment, the test apparatus that performs a test by providing the test pattern to each device under test can be provided even if a plurality of device under test are tested in parallel.

What is claimed is:

1. A test apparatus that tests a plurality of devices under test, comprising:
   a common pattern generating section that generates a common pattern being the pattern of a test signal common to the plurality of devices under test;
   a plurality of logical comparison sections, each arranged corresponding to one of the devices under test and judging whether a comparison result of comparing a result signal outputted from the corresponding device under test in response to the test signal based on the common pattern with a reference voltage corresponds to an expected value;

an additional pattern storage section that preliminarily stores a plurality of additional patterns to be added to the common pattern, the plurality of additional patterns comprising patterns to be added when the comparison result corresponds to the expected value and patterns to be added when the comparison result does not correspond to the expected value; and a plurality of pattern adding sections, each arranged corresponding to one of the plurality of devices under test and selectively reading one of the plurality of additional patterns for the corresponding device under test based on whether the comparison result corresponds to the expected value and providing the additional pattern added with the common pattern to the corresponding device under test, wherein each of the devices under test has a plurality of memory cells connected in series on a data signal line and writes data to one of the plurality of memory cells by applying one of a plurality of writing voltages to the one of the plurality of memory cells and applying one of a plurality of passing voltages that passes a data signal indicative of the data to the other memory cells, and at least one of the plurality of additional patterns stored in the additional pattern storage section is for setting one of the plurality of writing voltages and one of the plurality of passing voltages.

2. The test apparatus as set forth in claim 1, wherein the additional pattern storage section stores the at least one of the additional patterns for setting one of the plurality of writing voltages and one of the plurality of passing voltages in ascending or descending order of the writing voltage or the passing voltage, and each of the plurality of pattern adding sections selectively reads the additional pattern for setting the minimum writing voltage and passing voltage for which the comparison result corresponds to the expected value from the plurality of additional patterns stored in the additional pattern storage section by using a binary search method and provides the same to the corresponding device under test.

3. The test apparatus as set forth in claim 1, wherein at least one of the plurality of additional patterns stored in the additional pattern storage section is for setting an output timing of a result signal, and each of the plurality of pattern adding sections selectively reads one of the at least one additional patterns for setting the output timing from the plurality of additional patterns stored in the additional pattern storage section and provides the same to the corresponding device under test.

4. The test apparatus as set forth in claim 3, wherein the additional pattern storage section stores the at least one of the additional patterns for setting the output timing in ascending or descending order of the output timing, and each of the plurality of pattern adding sections selectively reads the additional pattern for setting the earliest output timing for which the comparison result corresponds to the expected value from the plurality of additional patterns stored in the additional pattern storage section by using a binary search method and provides the same to the corresponding device under test.

5. The test apparatus as set forth in claim 1, wherein at least one of the plurality of additional patterns stored in the additional pattern storage section is for setting an output voltage of a result signal, and each of the plurality of pattern adding sections selectively reads one of the at least one additional patterns for setting the output voltage from the plurality of additional patterns stored in the additional pattern storage section and provides the same to the corresponding device under test.

6. The test apparatus as set forth in claim 5, wherein the additional pattern storage section stores the at least one of the additional patterns for setting the output voltage in ascending or descending order of the output voltage, and each of the plurality of pattern adding sections selectively reads the additional pattern for setting the lowest output voltage for which the comparison result corresponds to the expected value from the plurality of additional patterns stored in the additional pattern storage section by using a binary search method and provides the same to the corresponding device under test.

7. The test apparatus as set forth in claim 1, wherein the additional pattern storage section stores the at least one of the additional patterns for setting one of the plurality of writing voltages and one of the plurality of passing voltages in ascending or descending order of the writing voltage or the passing voltage.

8. A test method of testing a plurality of devices under test by using a test apparatus, comprising:

generating a common pattern being the pattern of a test signal common to the plurality of devices under test;

judging, for each of the plurality of devices under test, whether a comparison result of comparing a result signal outputted from the device under test in response to the test signal based on the common pattern with a reference voltage corresponds to the expected value, wherein the test apparatus comprises an additional pattern storage section that preliminarily stores a plurality of additional patterns to be added to the common pattern, the plurality of additional patterns comprising patterns to be added when the comparison result corresponds to the expected value and patterns to be added when the comparison result does not correspond to the expected value;

selectively reading one of the plurality of additional patterns for each of the devices under test from the additional pattern storage section based on whether the comparison result for the device under test corresponds to the expected value, and providing the additional pattern added with the common pattern to the device under test, wherein each of the devices under test has a plurality of memory cells connected in series on a data signal line and writes data to one of the plurality of memory cells by applying one of a plurality of writing voltages to the one of the plurality of memory cells and applying one of a plurality of passing voltages that passes a data signal indicative of the data to the other memory cells, and at least one of the plurality of additional patterns stored in the additional pattern storage section is for setting one of the plurality of writing voltages and one of the plurality of passing voltages.

9. The test method as set forth in claim 8, wherein the additional pattern storage section stores the at least one of the additional patterns for setting one of the plurality of writing voltages and one of the plurality of passing voltages in ascending or descending order of the writing voltage or the passing voltage, and the selectively reading an additional pattern for each of the devices under tests includes selectively reading the additional pattern for setting the minimum writing voltage and passing voltage for which the comparison result corresponds to the expected value from the plurality of additional patterns stored in the additional pattern storage section by using a binary search method and providing the same to the device under test.

10. The test method as set forth in claim 8, wherein
at least one of the plurality of additional patterns stored in the additional pattern storage section is for setting an output timing of a result signal, and
the selectively reading an additional pattern for each of the devices under test includes selectively reading one of the at least one additional patterns for setting the output timing from the plurality of additional patterns stored in the additional pattern storage section and providing the same to the device under test.

11. The test method as set forth in claim 10, wherein
the additional pattern storage section stores the at least one of the additional patterns for setting the output timing in ascending or descending order of the output timing, and
the selectively reading an additional pattern for each of the devices under test includes selectively reading the additional pattern for setting the earliest output timing for which the comparison result corresponds to the expected value from the plurality of additional patterns stored in the additional pattern storage section by using a binary search method and providing the same to the device under test.

12. The test apparatus as set forth in claim 8, wherein
at least one of the plurality of additional patterns stored in the additional pattern storage section is for setting an output voltage of a result signal, and
the selectively reading an additional pattern for each of the devices under test includes selectively reading one of the at least one additional patterns for setting the output voltage from the plurality of additional patterns stored in the additional pattern storage section and providing the same to the device under test.

13. The test method as set forth in claim 12, wherein
the additional pattern storage section stores the at least one of the additional patterns for setting the output voltage in ascending or descending order of the output voltage, and
the selectively reading an additional pattern for each of the devices under test includes selectively reading the additional pattern for setting the lowest output voltage for which the comparison result corresponds to the expected value from the plurality of additional patterns stored in the additional pattern storage section by using a binary search method and providing the same to the device under test.

14. The test method as set forth in claim 8, wherein the additional pattern storage section stores the at least one of the additional patterns for setting one of the plurality of writing voltages and one of the plurality of passing voltages in ascending or descending order of the writing voltage or the passing voltage.

* * * * *